(12) United States Patent
Lv et al.

(10) Patent No.: US 10,627,945 B2
(45) Date of Patent: Apr. 21, 2020

(54) TOUCHSCREEN, METHOD FOR TOUCH DETECTION, AND WEARABLE DEVICE

(71) Applicant: Anhui Huami Information Technology Co., Ltd., Hefei, Anhui (CN)

(72) Inventors: Baitao Lv, Anhui (CN); Tao Hu, Anhui (CN); Shaowei Yin, Anhui (CN)

(73) Assignee: Anhui Huami Information Technology Co., Ltd., Hefei, Anhui (CN)

( * ) Notice: Subject to any disclaimer, the term of this patent is extended or adjusted under 35 U.S.C. 154(b) by 0 days.

(21) Appl. No.: 16/236,277

(22) Filed: Dec. 28, 2018

(65) Prior Publication Data

US 2019/0302941 A1 Oct. 3, 2019

Related U.S. Application Data

(63) Continuation of application No. PCT/CN2018/112697, filed on Oct. 30, 2018.

(30) Foreign Application Priority Data

Mar. 29, 2018 (CN) .......................... 2018 1 0271619

(51) Int. Cl.
*G06F 3/041* (2006.01)
*H05K 1/18* (2006.01)
*G06F 1/16* (2006.01)
*G06F 3/044* (2006.01)

(52) U.S. Cl.
CPC .......... *G06F 3/0412* (2013.01); *G06F 1/1643* (2013.01); *G06F 1/1652* (2013.01); *G06F 3/044* (2013.01); *H05K 1/189* (2013.01)

(58) Field of Classification Search
CPC ...... G06F 3/041; G06F 3/0412; G06F 3/0416; G06F 3/044; G06F 2203/04103; G02F 1/13338; H05K 1/147; H05K 1/189; H05K 3/361; H05K 1/028; H05K 1/118; H05K 2201/05; H01L 27/323; H01L 51/0097

See application file for complete search history.

(56) References Cited

U.S. PATENT DOCUMENTS

| | | | | |
|---|---|---|---|---|
| 2008/0062139 A1* | 3/2008 | Hotelling | ............ | G02F 1/13338 345/173 |
| 2011/0001706 A1* | 1/2011 | Sanford | ................ | G06F 3/0412 345/173 |
| 2011/0279391 A1* | 11/2011 | Nakai | .................... | B60K 35/00 345/173 |

(Continued)

*Primary Examiner* — Koosha Sharifi-Tafreshi
(74) *Attorney, Agent, or Firm* — Young Basile Hanlon & MacFarlane, P.C.

(57) ABSTRACT

A touchscreen, a touch detection method, and a wearable device are provided. The touchscreen includes: a touch flexible printed circuit (FPC) comprising a first surface and a second surface; a cover having a touch region, wherein the first surface of the touch FPC is attached to a back surface of the touch region; and a main board comprising a display screen, wherein the second surface of the touch FPC is arranged above the display screen, wherein a region covered by the touch FPC on the display screen is smaller than a display region of the display screen, a touch operation is detected in the touch region using the touch FPC, and at least one of a touch position or a touch trace of the touch operation is determined.

20 Claims, 4 Drawing Sheets

(56) References Cited

U.S. PATENT DOCUMENTS

| | | | | |
|---|---|---|---|---|
| 2012/0098774 A1* | 4/2012 | Abe | ............... | G02F 1/133308 |
| | | | | 345/173 |
| 2013/0278547 A1* | 10/2013 | Wu | ............... | G06F 3/0416 |
| | | | | 345/174 |
| 2016/0026315 A1* | 1/2016 | Choi | ............... | G06F 3/0414 |
| | | | | 345/174 |

* cited by examiner

US 10,627,945 B2

TOUCHSCREEN, METHOD FOR TOUCH DETECTION, AND WEARABLE DEVICE

CROSS-REFERENCE TO RELATED APPLICATION(S)

This application is a continuation of International Application No. PCT/CN2018/112697, filed on Oct. 30, 2018, which claims priority to Chinese Patent Application No. 201810271619.4, filed on Mar. 29, 2018, the contents of both of which are hereby incorporated by reference in their entireties.

TECHNICAL FIELD

This disclosure relates to the field of wearable device, and in particular, to touchscreens and methods for touch detection on wearable devices.

BACKGROUND

With the development of communication technology, wearable devices are widely used. To improve human-computer interaction, more wearable devices begin to use touchscreen technology. In some instances, a touch module and a display module are designed as integrated. For example, an Indium Tin Oxide (ITO) conductive layer is added on top of the display screen and protected by hard glass. However, a touchscreen with ITO would suffer brightness reduction, and hardware cost of the touchscreen could be driven up.

SUMMARY

In one aspect, a touchscreen is provided and includes: a touch flexible printed circuit (FPC) comprising a first surface and a second surface; a cover having a touch region, wherein the first surface of the touch FPC is attached to a back surface of the touch region; and a main board comprising a display screen, wherein the second surface of the touch FPC is arranged above the display screen, wherein a region covered by the touch FPC on the display screen is smaller than a display region of the display screen, a touch operation is detected in the touch region using the touch FPC, and at least one of a touch position or a touch trace of the touch operation is determined.

In another aspect, a method of touch detection for a touchscreen is provided and includes: receiving a touch operation in a touch region of the touchscreen, wherein the touchscreen includes a touch flexible printed circuit (FPC) comprising a first surface and a second surface, a cover having the touch region, wherein the first surface of the touch FPC is attached to a back surface of the touch region, and a main board comprising a display screen, wherein the second surface of the touch FPC is arranged above the display screen, and a region covered by the touch FPC on the display screen is smaller than a display region of the display screen; and determining at least one of a touch position or a touch trace of the touch operation, wherein the touch operation is detected using the touch FPC.

In another aspect, an apparatus is provided and includes: a touch flexible printed circuit (FPC) comprising a first surface and a second surface; a cover having a touch region, wherein the first surface of the touch FPC is attached to a back surface of the touch region; a main board comprising a display screen, wherein the second surface of the touch FPC is arranged above the display screen, and a region covered by the touch FPC on the display screen is smaller than a display region of the display screen; a processor; and a memory coupled to the processor, the memory configured to store instructions which when executed by the processor become operational with the processor to receive a touch operation in the touch region; and determine at least one of a touch position or a touch trace of the touch operation, wherein the touch operation is detected using the touch FPC.

In another aspect, a non-transitory computer-readable storage medium is provided. The non-transitory computer-readable storage medium includes instructions of touch detection for a touchscreen, which when executed by a processor become operational with the processor to: receive a touch operation in a touch region of the touchscreen, wherein the touchscreen comprises a touch flexible printed circuit (FPC) comprising a first surface and a second surface, a cover having the touch region, wherein the first surface of the touch FPC is attached to a back surface of the touch region, and a main board comprising a display screen, wherein the second surface of the touch FPC is arranged above the display screen, and a region covered by the touch FPC on the display screen is smaller than a display region of the display screen; and determine at least one of a touch position or a touch trace of the touch operation, wherein the touch operation is detected using the touch FPC.

In another aspect, a wearable device is provided and includes: a touch screen, comprising: a touch flexible printed circuit (FPC) comprising a first surface and a second surface; a cover having a touch region, wherein the first surface of the touch FPC is attached to a back surface of the touch region; and a main board comprising a display screen, wherein the second surface of the touch FPC is arranged above the display screen, wherein a region covered by the touch FPC on the display screen is smaller than a display region of the display screen, a touch operation is detected in the touch region using the touch FPC, and at least one of a touch position or a touch trace of the touch operation is determined; a processor; and a memory coupled to the processor, the memory configured to store instructions which when executed by the processor become operational with the processor to: receive a touch operation in the touch region; and determine at least one of a touch position or a touch trace of the touch operation, wherein the touch operation is detected using the touch FPC.

BRIEF DESCRIPTION OF THE DRAWINGS

This disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Herein, example implementations or embodiments will be described in detail and illustrated in accompanying figures. When the following description refers to the accompanying figures, the same label in different figures represents the same or similar element unless indicated otherwise. The implementations described in examples do not represent all implementations that are consistent with this disclosure. Rather, they are merely example apparatuses and methods consistent with aspects of this disclosure as detailed in the appended claims.

The terms used herein are for the purpose of describing implementations only and are not intended to limit this disclosure. The singular forms "a," "an," and "the" used herein intend to include plural forms unless the context clearly indicates otherwise. It should also be understood that the term "and/or" as used herein refers to and encompasses any or all of one or more possible combinations of the associated listed items.

It is also understood that the term "and/or" as used herein refers to and includes any or all possible combinations of one or more of the associated listed items.

It should be understood that although the terms "first," "second," "third," etc. can be used to describe various kinds of information in this disclosure, the information should not be limited to these terms. These terms are only used to distinguish the same type of information from each other. For example, without departing from the scope of this disclosure, the first information can also be referred to as the second information. Similarly, the second information can also be referred to as the first information. Depending on the context, the word "if" as used herein can be interpreted as "when," "while," or "in response to."

Figure 1:
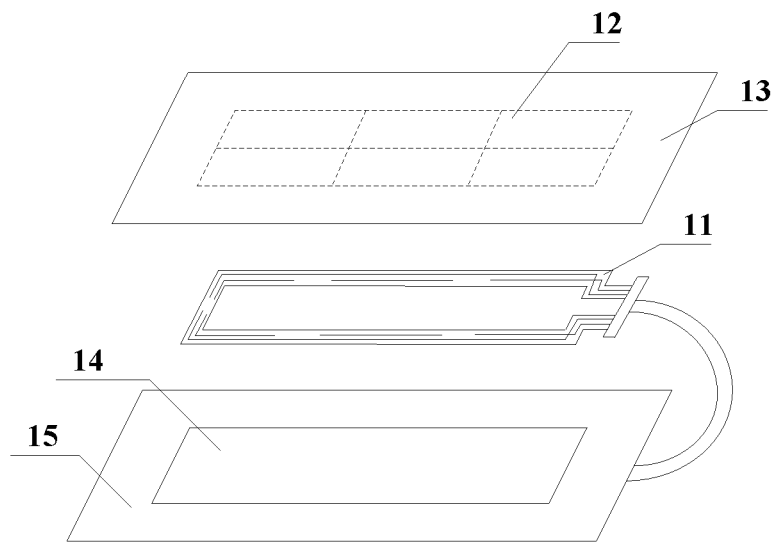
FIG. 1 is a diagram of structures of an example touchscreen according to implementations of this disclosure.

FIG. 1 is a diagram of structures of an example touchscreen according to implementations of this disclosure. As shown in FIG. 1, the touchscreen includes: a touch flexible printed circuit (FPC) 11, a cover 13 having a touch region 12, and a main board 15 having a display screen 14. A first surface of the touch FPC 11 can be attached to a back surface of the touch region 12, and a second surface of the touch FPC 11 can be placed above the display screen 14. A region covered by the touch FPC 11 on the display screen 14 can be smaller than a display region of the display screen 14. The touchscreen can sense a touch operation in the touch region 12 through the touch FPC 11 and determine a touch position and/or a touch trace of the touch operation.

In some implementations, the touch FPC 11 can be attached beneath the cover 13 and form a touch region on the cover 13, that is, the touch region 12. A user can perform the touch operation in the touch region 12, such as sliding up, down, left, or right, or clicking. The touch region 12 of the touch FPC 11 can be divided into multiple small regions (e.g., 6 small regions as shown by the dotted line in the touch region 12 in FIG. 1). The touch FPC 11 can sense a touch operation occurring in each small region and determine a touch position and/or a touch trace of the touch operation.

In some implementations, the touchscreen can be a projected capacitive touchscreen, which can be suitable for a wearable device with a small screen. The cover 13 can be a non-metal cover. The main board 15 can be a printed circuit board (PCB). The display screen 14 can be an organic light emitting display (OLED) or a liquid crystal display (LCD).

In addition, to improve human-computer interaction, more wearable devices begin to use touchscreen technology. In some instances, if the touchscreen uses ITO, the ITO can reduce the brightness of the touchscreen, and increase the cost of the touchscreen. The touchscreen in this disclosure uses FPC, purporting the advantages of low cost and simple assembly of FPC. Also, because light transmittance of ITO cannot reach 100%, using ITO can reduce the brightness of the touchscreen. However, by using FPC, the touch FPC 11 would not cover all of the display region of the display screen 14. Therefore, the touchscreen using the FPC would not affect the brightness of the touchscreen, rather, it can improve the brightness of the touchscreen.

In the above implementations, the touchscreen of this disclosure uses the touch FPC that does not cover all display regions of the display screen, thus the brightness of the touchscreen can be increased, and the hardware cost of the touchscreen can be reduced.

Further, according to this disclosure, a touchscreen implementation can be specifically designed for a product with a smaller screen to reduce the hardware cost of the product (e.g., by replacing the ITO with the FPC). Thus, the brightness of the touchscreen can be increased, and the raw-material and assembly cost of the touchscreen can be reduced.

Figure 1A:
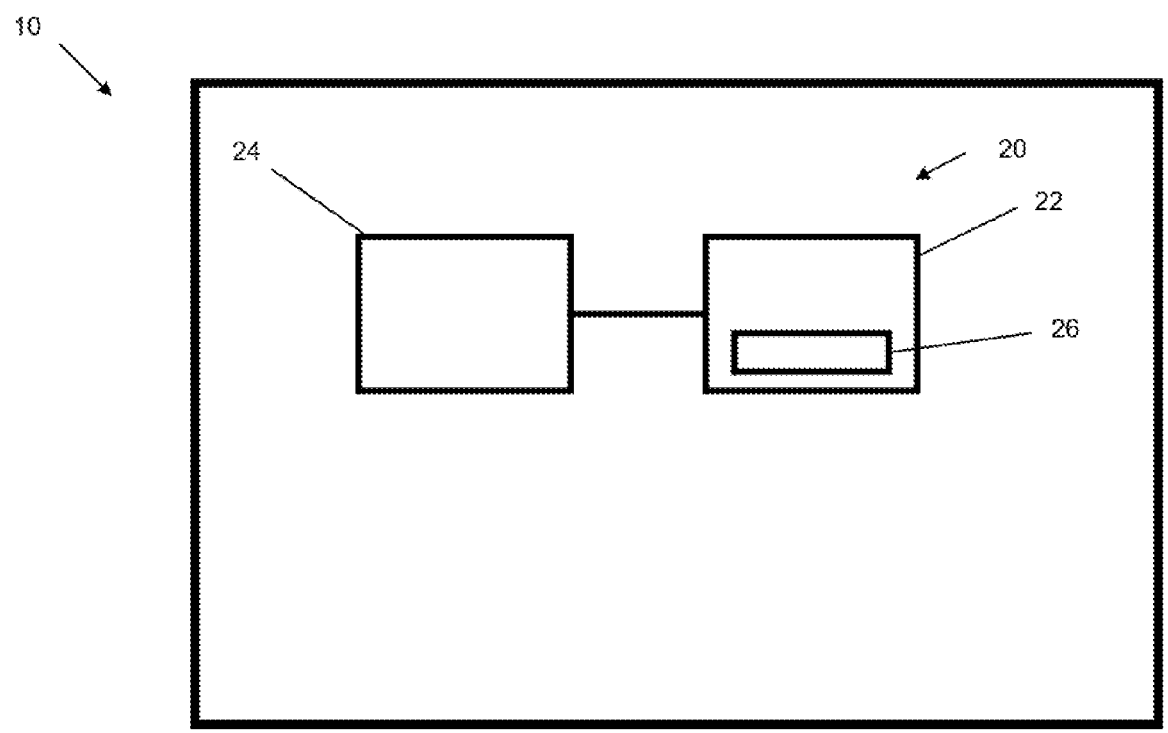
FIG. 1A is a diagram of a touchscreen including a processor and memory.

FIG. 1A shows a touchscreen 10 including memory 20 and processor 24 in communication. The memory 20 is a non-transitory computer-readable storage medium 22 including instructions 26.

Figure 2:
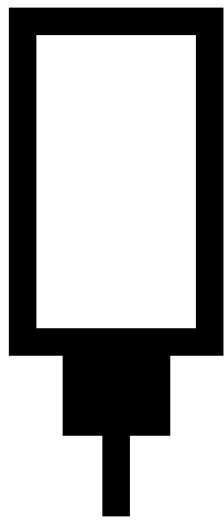
FIG. 2 is a diagram of a shape of an example touch flexible printed circuit (FPC) according to implementations of this disclosure.

In an implementation, the touch FPC 11 can be a strip structure placed around the display screen 14, as shown in FIG. 2. For example, the touch FPC 11 can be in a hollow rectangular shape. The coverage of the touch FPC 11 can be slightly smaller than the touch region 12 and the display screen 14, so that the touch FPC 11 placed above the display screen 14 does not cover all the display regions of the display screen 14. By such configuration, the brightness of the touchscreen can be not affected.

In an implementation, the touch FPC 11 can include a capacitive sensing circuit and a capacitive detection circuit connected to the capacitive sensing circuit. The capacitive sensing circuit can be used to sense the touch operation in the touch region 12. The capacitive detection circuit can be used to determine a touch position and/or a touch trace of the touch operation in the touch region 12.

In an implementation, the capacitive sensing circuit and the capacitive detection circuit can be both arranged above the touch FPC 11. The touch region 12 of the touch FPC 11 can be divided into multiple small regions. Through the capacitive sensing circuits distributed in each small region, the touch FPC 11 can sense the touch operation occurring in a small region and determine a touch position and/or a touch trace of the touch operation by a capacitive detection circuit.

In an implementation, the touch FPC 11 can include a capacitive sensing circuit, and a main board 15 can include a capacitive detection circuit connected to the capacitive sensing circuit. The capacitive sensing circuit can be used to sense the touch operation in the touch region 12. The capacitive detection circuit can be used to determine a touch position and/or a touch trace of the touch operation in the touch region 12.

In an implementation, the capacitive sensing circuit can be above the touch FPC 11, and the capacitive detection circuit can be above the main board 15. The touch region 12 of the touch FPC 11 can be divided into multiple small regions. Through the capacitive sensing circuits distributed in each small region, the touch FPC 11 can sense a touch operation occurring in a small region. The sensed information can be sent to the capacitive detection circuit in the main board 15. The capacitive detection circuit on the main board 15 can determine a touch position and/or a touch trace of the touch operation in the touch region 12.

In an implementation, the capacitive sensing circuit on the touch FPC 11 may include a transmitting electrode and a receiving electrode; wherein the capacitive sensing circuit determines that the touch region is sensed by a change in capacitance between the transmitting electrode and the receiving electrode. When the touch operation of 12, the capacitance change information is sent to the capacitive detection circuit; the capacitive detection circuit determines the touch position and/or touch trace of the touch operation of the touch region 12 according to the capacitance change information sent by the capacitive sensing circuit.

The capacitive sensing circuit on the touch FPC 11 can include a transmitting electrode and a receiving electrode. The capacitive sensing circuit can determine the touch operation in the touch region 12 by sensing a change in capacitance between the transmitting electrode and the receiving electrode. The capacitance change information can be sent to the capacitive detection circuit. The capacitive detection circuit can determine a touch position and/or a touch trace of the touch operation in the touch region 12 according to the capacitance change information sent by the capacitive sensing circuit.

Figure 3:
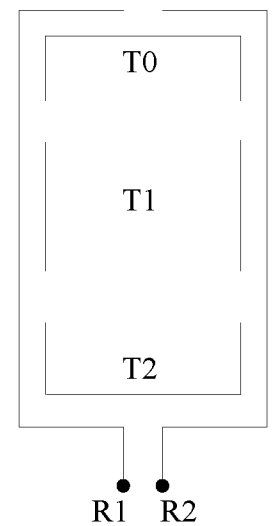
FIG. 3 is a diagram of a circuit layout of an example touch FPC according to implementations of this disclosure.

As shown in FIG. 3, the touch FPC 11 can include transmitting electrodes T0, T1, and T2 and receiving electrodes R1 and R2. The touch region 12 of the touch FPC 11 can be divided by T0-T2 and R1-R2 into multiple (e.g., 6) small regions. In some implementations, the capacitance change of each small region can be individually detected. The capacitive detection circuit can determine a touch position and/or a touch trace of the touch operation in the touch region 12 by scanning capacitance change information of each small region. In some implementations, the number of small regions can be determined according to the size of the touchscreen and the resolution of the report points. The numbers of TX (e.g., T0, T1, and T2) and RX (e.g., R1 and R2) can be determined after the number of small regions having been determined. TX represents the transmitting electrodes of the capacitive sensing circuit. RX represents the receiving electrodes of the capacitive sensing circuit.

Figure 4:
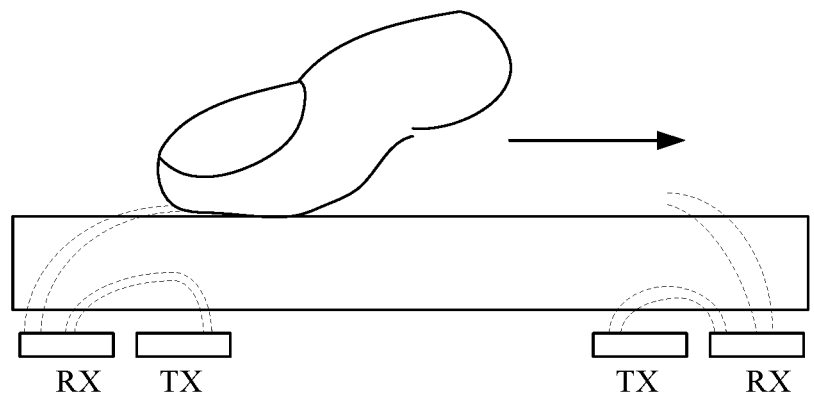
FIG. 4 is a diagram of a touch on an example touchscreen according to implementations of this disclosure.

As shown in FIG. 4, when a user's finger touches the touch region 12 on the left side, the capacitance between the TX and RX on the left side of the touch FPC can change. When the user's finger slides from the left side to the right side, the capacitance between the TX and RX on the right side of the touch FPC can also change. The capacitive detection circuit can determine the touch position and/or the touch trace of the touch operation by detecting the change trend of the capacitance of each region.

In some implementations, the touchscreen uses a mutual capacitance detection technique to measure the capacitance between adjacent sensing electrodes (e.g., the capacitance between TX and RX). As shown in FIG. 4, adjacent sensing electrodes can have a mutual capacitance. When the user's finger touches the region between the adjacent sensing electrodes, the finger can shield a part of the electric field between the sensing electrodes and make the mutual capacitance smaller. Therefore, by detecting the capacitance changes between the TX and RX, the touch action of the user's finger can be determined. The capacitive detection circuit on the touch FPC 11 or the main board 15 can detect the capacitance change trends between each TX and RX to determine the touch position and/or the touch trace of the touch operation.

In an implementation, the main board 15 can include a micro control unit (MCU).

The MCU can be used to determine executable instructions corresponding to the touch position and/or the touch trace of the touch operation in the touch region 12 and execute the executable instructions. The display screen 14 can be used to display an execution result corresponding to the execution instructions.

Figure 5:
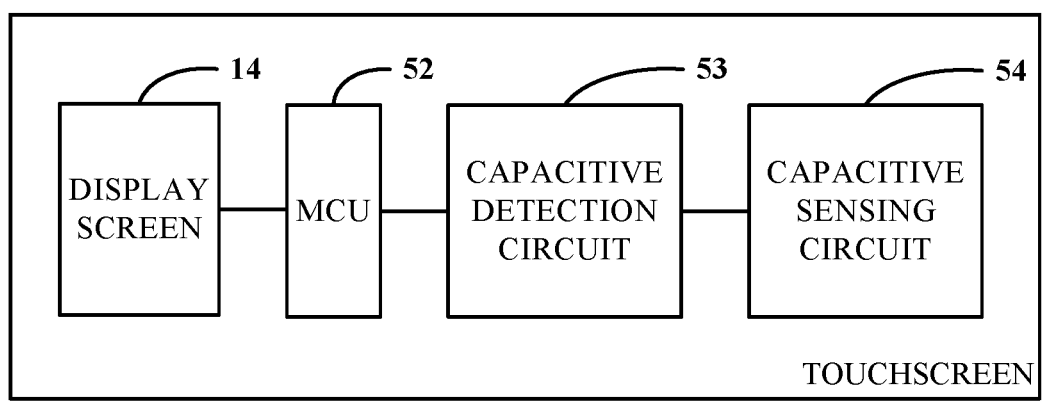
FIG. 5 is a diagram of a circuit of an example touchscreen according to implementations of this disclosure.

As shown in FIG. 5, the touch FPC 11 can be the core device of the touchscreen and plays an important role in the circuit design. In some implementations, the touch FPC can be placed around the display screen to detect capacitance changes for each capacitive sensing electrodes. Based on the capacitance changes, a touch operation can be identified. This design can be suitable for smart wearable products with small screen. The capacitance change caused by each of the user's touches can be detected by the capacitive sensing circuit 54 placed around the display screen and transmitted to the capacitive detection circuit 53. The capacitive detection circuit 53 can determine a touch position and/or a touch trace of the touch operation according to the capacitance changes of each small region. The MCU 52 can determine the executable instructions corresponding to the touch position and/or the touch trace of the touch operation and execute the executable instructions. The display screen 14 can display the execution result corresponding to the executable instructions.

Figure 6:
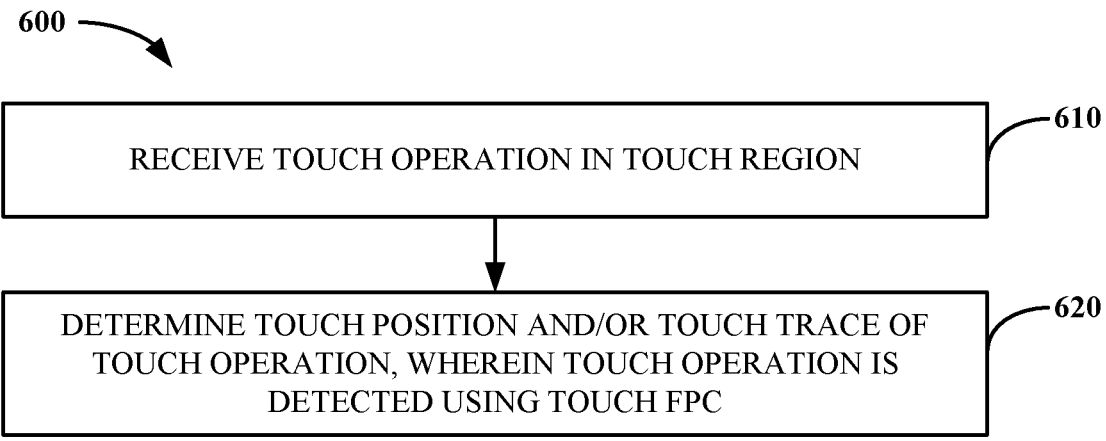
FIG. 6 is a flowchart of an example process for touch detection according to implementations of this disclosure.

FIG. 6 is a flowchart of an example process 600 for touch detection according to implementations of this disclosure. The process 600 can be implemented using the touchscreen as shown and described in any of FIG. 1 to FIG. 5. The touchscreen can be used on a wearable device (e.g., a smart wristband). The touchscreen can include a touch FPC 11, a cover 13 having a touch region 12, and a main board 15 having a display screen 14. A first surface of the touch FPC 11 can be attached to a back surface of the touch region 12, and a second surface of the touch FPC 11 can be placed above the display screen 14. A region covered by the touch FPC 11 on the display screen 14 can be smaller than a display region of the display screen 14. As shown in FIG. 6, the process 600 can include the following operations.

At operation 610, a touch operation is received in a touch region. For example, the touch operation can be a touch operation implemented by an individual in the touch region 12, such as sliding up, down, left, or right, or clicking.

At operation 620, the touch operation is detected by a touch flexible printed circuit (PFC), and at least one of a touch position or a touch trace of the touch operation is determined.

In an implementation, the touch FPC can include a capacitive sensing circuit and a capacitive detection circuit connected to the capacitive sensing circuit. When performing the operation 620, the process 600 can further include: detecting the touch operation in the touch region using the capacitive sensing circuit; and determining at least one of the touch position or the touch trace using the capacitive detection circuit of the touch FPC.

In an implementation, the touch FPC can include a capacitive sensing circuit, the main board can include a capacitive detection circuit connected to the capacitive sensing circuit. When performing the operation 620, the process 600 can further include: detecting the touch operation in the touch region using the capacitive sensing circuit; and determining at least one of the touch position or the touch trace using the capacitive detection circuit of the touch FPC of the main board.

Figure 7:
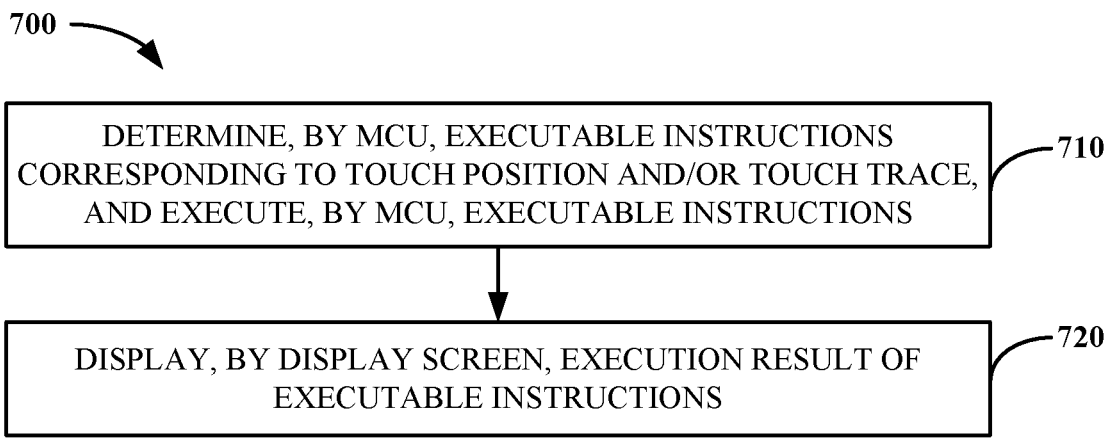
FIG. 7 is a flowchart of another example process for touch detection according to implementations of this disclosure.

In an implementation, the capacitive sensing circuit can include a transmitting electrode and a receiving electrode. When detecting the touch operation in the touch region using the capacitive sensing circuit, the process 600 can further include: determining the touch operation based on a capacitance change between the transmitting electrode and the receiving electrode; and transmitting data indicative of the capacitance change to the capacitive detection circuit In an implementation, the main board can include a micro control unit (MCU). As shown in FIG. 7, the process for touch detection can further include the following operations.

At operation 710, executable instructions corresponding to at least one of the touch position or the touch trace are determined and executed by the MCU.

At operation 720, an execution result of the executable instructions is displayed by the display screen.

It can be seen from the above implementations that by using the touch FPC that does not cover all display regions of the display screen, the brightness of the touchscreen can be increased, and the hardware cost of the touchscreen can be reduced.

Further, according to this disclosure, a touchscreen implementation can be specifically designed for a product with a smaller screen to reduce the hardware cost of the product (e.g., by replacing the ITO with the FPC). Thus, the brightness of the touchscreen can be increased, and the raw-material and assembly cost of the touchscreen can be reduced.

Correspondingly, a wearable device is further provided in this disclosure, which includes the touchscreen as shown and described in FIGS. 1-5 and performs touch detection as shown and described in FIGS. 6-7.

It can be seen from the above implementation that, by using the FPC touchscreen to the wearable device, the wearable device can have a good cost advantage while having the touchscreen.

Other implementations of this disclosure are readily apparent to those skilled in the art upon consideration of the specification and practice of the disclosure disclosed herein. This disclosure is intended to cover any variations, uses or adaptations of this disclosure. Such variations, uses or adaptive changes follow the general principles of this disclosure and include common general knowledge or tactical techniques in the art that are not detailed in this disclosure. The specification and implementations are only considered as examples. The true scope and spirit of this disclosure is defined by the appended claims.

It is also to be understood that the terms "comprise," "include," or any other variants are intended to encompass a non-exclusive inclusion, such that a process, a method, an item, or a device includes other elements that are not explicitly listed, or elements that are inherent to such a process, method, item, or device. Without further restrictions, the elements qualified by the terms "including one . . . " does not exclude that there are additional identical elements in the process, method, item or device that includes those elements.

The above is only example implementations of this disclosure and is not intended to limit this disclosure. Any modifications, equivalents, or improvements within the spirit and principles of this disclosure should be included within the protection scope of this disclosure.

What is claimed is:

1. A touchscreen, comprising:
 a touch flexible printed circuit (FPC) comprising a first surface and a second surface;
 a cover having a touch region, wherein the first surface of the touch FPC is attached to a back surface of the touch region; and
 a main board comprising a display screen, wherein the second surface of the touch FPC is arranged above the display screen, wherein
  a region covered by the touch FPC on the display screen is smaller than a display region of the display screen,
  a touch operation is detected in the touch region using the touch FPC,
  at least one of a touch position or a touch trace of the touch operation is determined; and
  wherein the touch FPC has a strip structure arranged around a periphery of the display screen and having a hollow center.

2. The touchscreen of claim 1, wherein the touch FPC comprises:
 a capacitive sensing circuit, configured to detect the touch operation; and
 a capacitive detection circuit, connected to the capacitive sensing circuit, configured to determine at least one of the touch position or the touch trace.

3. The touchscreen of claim 2, wherein
 the capacitive sensing circuit comprises a transmitting electrode and a receiving electrode, and is further configured to:
  determine the touch operation based on a capacitance change between the transmitting electrode and the receiving electrode; and
  transmit data indicative of the capacitance change to the capacitive detection circuit; and
 the capacitive detection circuit is further configured to determine at least one of the touch position or the touch trace based on the data indicative of the capacitance change.

4. The touchscreen of claim 1, wherein
 the touch FPC comprises a capacitive sensing circuit, configured to detect the touch operation; and
 the main board comprises a capacitive detection circuit connected to the capacitive sensing circuit, wherein the capacitive detection circuit is configured to determine at least one of the touch position or the touch trace.

5. The touchscreen of claim 1, wherein
 the main board further comprises a micro control unit (MCU);
 the MCU is configured to:
  determine executable instructions corresponding to at least one of the touch position or the touch trace; and
  executing the executable instructions; and
 the display screen is configured to display an execution result of the executable instructions.

6. A method of touch detection for a touchscreen, comprising:
 receiving a touch operation in a touch region of the touchscreen, wherein the touchscreen comprises:
  a touch flexible printed circuit (FPC) comprising a first surface and a second surface,
  a cover having the touch region, wherein the first surface of the touch FPC is attached to a back surface of the touch region, and
  a main board comprising a display screen, wherein the second surface of the touch FPC is arranged above the display screen, and a region covered by the touch FPC on the display screen is smaller than a display region of the display screen; and determining at least one of a touch position or a touch trace of the touch operation, wherein the touch operation is detected using the touch FPC; and wherein the touch FPC has a strip structure arranged around a periphery of the display screen and having a hollow center.

7. The method of claim 6, wherein the touch FPC comprises a capacitive sensing circuit and a capacitive detection circuit connected to the capacitive sensing circuit, and determining at least one of the touch position or the touch trace of the touch operation comprises:

detecting the touch operation using the capacitive sensing circuit; and determining at least one of the touch position or the touch trace using the capacitive detection circuit.

8. The method of claim 7, wherein the capacitive sensing circuit comprises a transmitting electrode and a receiving electrode, and detecting the touch operation using the capacitive sensing circuit comprises:

determining the touch operation based on a capacitance change between the transmitting electrode and the receiving electrode; and transmitting data indicative of the capacitance change to the capacitive detection circuit.

9. The method of claim 6, wherein the touch FPC comprises a capacitive sensing circuit and the main board comprises a capacitive detection circuit connected to the capacitive sensing circuit, and determining at least one of the touch position or the touch trace of the touch operation comprises:

detecting the touch operation using the capacitive sensing circuit; and determining at least one of the touch position or the touch trace using the capacitive detection circuit of the main board.

10. The method of claim 6, wherein the main board further comprises a micro control unit (MCU), and the method further comprises:

determining, by the MCU, executable instructions corresponding to at least one of the touch position or the touch trace;

executing, by the MCU, the executable instructions; and displaying, by the display screen, an execution result of the executable instructions.

11. An apparatus, comprising:

a touch flexible printed circuit (FPC) comprising a first surface and a second surface;

a cover having a touch region, wherein the first surface of the touch FPC is attached to a back surface of the touch region;

a main board comprising a display screen, wherein the second surface of the touch FPC is arranged above the display screen, and a region covered by the touch FPC on the display screen is smaller than a display region of the display screen;

a processor; and a memory coupled to the processor, the memory configured to store instructions which when executed by the processor become operational with the processor to:

receive a touch operation in the touch region; and determine at least one of a touch position or a touch trace of the touch operation, wherein the touch operation is detected using the touch FPC; and wherein the touch FPC has a strip structure arranged around a periphery of the display screen and having a hollow center.

12. The apparatus of claim 11, further comprising:

a touch screen, the touch screen comprising the touch FPC, the cover, and the main board, wherein the touch operation is detected in the touch region using the touch FPC, and at least one of the touch position or the touch trace of the touch operation is determined.

13. The apparatus of claim 11, wherein the touch FPC has a strip structure arranged around the display screen.

14. The apparatus of claim 11, wherein the touch FPC comprises:

a capacitive sensing circuit, configured to detect the touch operation; and a capacitive detection circuit, connected to the capacitive sensing circuit, configured to determine at least one of the touch position or the touch trace.

15. The apparatus of claim 14, wherein the capacitive sensing circuit comprises a transmitting electrode and a receiving electrode, and is further configured to:

determine the touch operation based on a capacitance change between the transmitting electrode and the receiving electrode; and transmit data indicative of the capacitance change to the capacitive detection circuit; and the capacitive detection circuit is further configured to determine at least one of the touch position or the touch trace based on the data indicative of the capacitance change.

16. The apparatus of claim 11, wherein the touch FPC comprises a capacitive sensing circuit, configured to detect the touch operation; and the main board comprises a capacitive detection circuit connected to the capacitive sensing circuit, wherein the capacitive detection circuit is configured to determine at least one of the touch position or the touch trace.

17. The apparatus of claim 11, wherein the main board further comprises a micro control unit (MCU);

the MCU is configured to:

determine executable instructions corresponding to at least one of the touch position or the touch trace; and executing the executable instructions; and the display screen is configured to display an execution result of the executable instructions.

18. A non-transitory computer-readable storage medium, comprising instructions of touch detection for a touchscreen, which instructions when executed by a processor become operational with the processor to:

receive a touch operation in a touch region of the touchscreen, wherein the touchscreen comprises:

a touch flexible printed circuit (FPC) comprising a first surface and a second surface, a cover having the touch region, wherein the first surface of the touch FPC is attached to a back surface of the touch region, and a main board comprising a display screen, wherein the second surface of the touch FPC is arranged above the display screen, and a region covered by the touch FPC on the display screen is smaller than a display region of the display screen; and determine at least one of a touch position or a touch trace of the touch operation, wherein the touch operation is detected using the touch FPC; and wherein the touch FPC has a strip structure arranged around a periphery of the display screen and having a hollow center.

19. The non-transitory computer-readable storage medium of claim 18, wherein the touch FPC comprises a capacitive sensing circuit and a capacitive detection circuit connected to the capacitive sensing circuit, and determining at least one of the touch position or the touch trace of the touch operation comprises:
  detecting the touch operation using the capacitive sensing circuit; and
  determining at least one of the touch position or the touch trace using the capacitive detection circuit.

20. The touchscreen of claim 1, wherein the strop structure is continuous and has a rectangular shape.

* * * * *